(12) United States Patent
Takahashi

(10) Patent No.: US 8,633,768 B2
(45) Date of Patent: Jan. 21, 2014

(54) AMPLIFYING DEVICE

(75) Inventor: Yuji Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 59 days.

(21) Appl. No.: 13/510,286

(22) PCT Filed: Oct. 28, 2010

(86) PCT No.: PCT/JP2010/069181
§ 371 (c)(1),
(2), (4) Date: May 16, 2012

(87) PCT Pub. No.: WO2011/062039
PCT Pub. Date: May 26, 2011

(65) Prior Publication Data
US 2012/0229213 A1    Sep. 13, 2012

(30) Foreign Application Priority Data
Nov. 17, 2009  (JP) .................... 2009-261919

(51) Int. Cl.
*H03G 3/20* (2006.01)

(52) U.S. Cl.
USPC ............. 330/136; 330/297; 330/127; 330/10; 330/207 A; 455/127.1

(58) Field of Classification Search
USPC ................ 330/136, 297, 127, 10, 207 A; 455/127.1
See application file for complete search history.

(56) References Cited

U.S. PATENT DOCUMENTS

| | | | |
|---|---|---|---|
| 5,905,407 A | 5/1999 | Midya | |
| 6,710,646 B1 | 3/2004 | Kimball | |

(Continued)

FOREIGN PATENT DOCUMENTS

| | | |
|---|---|---|
| JP | 2005-020696 A | 1/2005 |
| JP | 2008-537249 A | 9/2008 |
| JP | 2009-159218 A | 7/2009 |
| WO | WO 2006/111891 A1 | 10/2006 |
| WO | WO 2009/101905 A1 | 8/2009 |

OTHER PUBLICATIONS

International Microwave Symposium 2009 Digest, pp. 413-416 (IMS2009 WE1A-1),"A 45/46/34% PAE Linear Polar Transmitter for EDGE/WCDMA/Mobile-WiMax", Jinsung Choi et al., Postech, Korea.

(Continued)

*Primary Examiner* — Patricia Nguyen
(74) *Attorney, Agent, or Firm* — McGinn IP Law Group, PLLC

(57) ABSTRACT

To provide an envelope tracking type amplifier that has high efficiency and small fluctuations, an output unit supplies an output signal that is adjusted corresponding to an input signal to a power supply terminal of the amplifier. The output unit includes an analog amplifying circuit that amplifies the input signal; a digital circuit that selectively outputs a first voltage or a second voltage that is lower than the first voltage; and first and second output circuits. The first output circuit includes a first integrating circuit that integrates an output signal of the digital circuit; and a combining section that combines an output signal of the first integrating circuit and an output signal of the analog amplifying circuit and outputs the combined signal to a power supply terminal of the amplifier. The second output circuit includes a second integrating circuit that integrates the output signal of the digital circuit; a resistor having two ends, one end being connected to an output terminal of the second integrating circuit, the other end being connected to an output terminal of the analog amplifying circuit; and a load connected to the output terminal of the second integrating circuit. The digital circuit outputs the first voltage where a voltage applied at the one end of the resistor is lower than the voltage applied at the other end of the resistor and the digital circuit outputs the second voltage when the voltage applied at the one end of the resistor is higher than the voltage applied at the other end of the resistor.

20 Claims, 15 Drawing Sheets

(56) References Cited

U.S. PATENT DOCUMENTS

| | | | |
|---|---|---|---|
| 7,359,680 B2 * | 4/2008 | Klemmer | 455/102 |
| 8,030,995 B2 * | 10/2011 | Okubo et al. | 330/127 |
| 8,238,853 B2 * | 8/2012 | Drogi et al. | 455/127.2 |
| 8,451,054 B2 * | 5/2013 | Kunihiro et al. | 330/136 |
| 8,493,141 B2 * | 7/2013 | Khlat et al. | 330/127 |
| 8,508,297 B2 * | 8/2013 | Honda et al. | 330/136 |
| 2004/0208262 A1 | 10/2004 | Midya et al. | |
| 2004/0266366 A1 | 12/2004 | Robinson et al. | |
| 2008/0252380 A1 | 10/2008 | Blanken | |
| 2009/0167427 A1 | 7/2009 | Kawamoto et al. | |

OTHER PUBLICATIONS

IEEE Radio Frequency Integrated Circuit Symposium 2009 Digest, pp. 141-144 (RFIC2009 RMO2C-1), "A Hybrid Envelope Modulator Using Feedforward Control for OFDM WLAN Polar Transmitter", Chih-Chang Lee et al., STC, ITRI, Taiwan.

International Search Report in PCT/JP2010/069181 dated Jan. 18, 2011 (English Translation Thereof).

* cited by examiner

AMPLIFYING DEVICE

TECHNICAL FIELD

The present invention relates to an amplifying device, for example, an amplifying device that amplifies a high frequency signal.

BACKGROUND ART

FIG. 1 is a block diagram showing a class AB amplifier according to the related art. In FIG. 1, in a situation in which a DC voltage of DC power supply 1070 is applied at power supply terminal 1003a of power amplifier 1003, when an input signal of the amplifier is input to signal input terminal 1003b of power amplifier 1003, a class AB amplifier amplifies the input signal of the amplifier.

FIG. 2 is a circuit diagram showing an example of an internal circuit of power amplifier 1003. In FIG. 2, power amplifier 1003 consists of field effect transistor (FET) 1080 and inductor element 1052 in a situation in which a gate bias circuit and so forth are omitted from power amplifier 1003. Alternatively, a resistor element or a transmission line may be used instead of inductor element 1052.

In FET 1080, a source electrode is grounded, the input signal of the amplifier is input to a gate electrode, and a DC voltage is applied at a drain electrode through inductor element 1052, a resistor element, or a transmission line. The drain terminal is also an output terminal of the amplifier.

FIG. 3 is a waveform chart showing the relationship between input signal of the amplifier 1204 that is amplified by the class AB amplifier shown in FIG. 1 and DC voltage 1205 that is a supply voltage of the class AB amplifier shown in FIG. 1.

As shown in FIG. 3, in the class AB amplifier shown in FIG. 1, regardless of the amplitude of input signal of the amplifier 1204, DC voltage 1205 applied to power amplifier 1003 was constant. Thus, the class AB amplifier shown in FIG. 1 had a problem as regards a low power efficiency due to wasteful power caused by heat generation and so forth.

FIG. 4 is a block diagram showing an envelope tracking amplifier (ET amplifier) that solves such a problem.

In FIG. 4, the ET amplifier obtains an envelope signal (AM (amplitude modulation) signal) having the waveform of the input signal of the amplifier from an envelope detector (detector) or a base band itself. The AM signal is amplified by envelope amplifier 1009 and the amplified signal is input to power supply terminal 1003a. In addition, a signal containing a phase component (PM (phase modulation)) of the input signal of the amplifier is input to signal input terminal 1003b. Power amplifier 1003 amplifies the signal that is input to signal input terminal 1003b.

FIG. 5 is a waveform chart showing the relationship between input signal of the amplifier 1207 amplified by the ET amplifier and supply voltage 1206. As shown in FIG. 5, since input signal of the amplifier 1207 is synchronized with supply voltage 1206, the lower the power of the input signal of the amplifier, the lower the supply voltage and the higher the power of the input signal of the amplifier, the higher the supply voltage. As a result, since the wasteful power decreases, the efficiency improves.

In the ET amplifier, a signal that is input to power amplifier 1003 (input signal of the amplifier) may be only a phase component signal (PM signal). Alternatively, that signal that is input to power amplifier 1003 may be a signal that contains the PM signal and the envelope component (AM signal). The former amplifier may be generally referred to as the polar modulation amplifier or envelope elimination and restoration (EER) amplifier, whereas the later amplifier may be generally referred to as the envelope tracking amplifier. However, since the amount of the AM signal in the signal that is input to power amplifier 1003 is a trivial matter, these amplifiers are collectively referred to as the envelope tracking amplifier (ET amplifier).

The efficiency of the ET amplifier is represented by the product of the efficiency of power amplifier 1003 and the efficiency of envelope amplifier 1009. Thus, not only the efficiency of the amplifier, but also the efficiency of the envelope amplifier needs to be improved. As a result, a circuit that has both a high efficient digital amplifier and a low pass filter (that operates as an integrating circuit) has been widely used as a constituent element of the envelope amplifier.

FIG. 6 is a schematic diagram showing an ET amplifier that includes an envelope amplifier provided with a digital amplifier and a low pass filter; and a power amplifier. In FIG. 6, the ET amplifier includes linear amplifier 1001 that is an analog amplifier, resistor element 1040, digital amplifier 1002, low pass filter 1007, and power amplifier 1003. Linear amplifier 1001, resistor element 1040, digital amplifier 1002, and low pass filter 1007 are included in envelope amplifier 1009. Digital amplifier 1002 and low pass filter 1007 are included in digital amplifier 1011.

FIG. 7 is a schematic diagram showing the ET amplifier shown in FIG. 6 in detail, more specifically, shows digital amplifier 1002 in detail.

FIG. 8 is a schematic diagram showing the ET amplifier shown in FIG. 6 in detail, more specifically, shows digital amplifier 1002 and low pass filter 1007 in detail.

In FIG. 7 and FIG. 8, digital amplifier 1002 is divided into comparator 1020, gate driver circuit 1021, and switching amplifier 1022. In FIG. 8, inductor element 1050 is used as low pass filter 1007.

Next, the operations of the ET amplifiers shown in FIG. 6, FIG. 7, and FIG. 8 will be described.

In these ET amplifiers, an AM signal is input to linear amplifier 1001. Comparator 1020 compares an output signal of linear amplifier 1001 with an output signal of digital amplifier 1011 (specifically, an output signal of low pass filter 1007). When the potential of the output signal of digital amplifier 1011 is higher than the potential of the output signal of linear amplifier 1001, comparator 1020 outputs a signal that represents "low"; when the potential of the output signal of linear amplifier 1001 is higher than the potential of the output signal of digital amplifier 1011, comparator 1020 outputs a signal that represents "high".

The output signal of comparator 1020 is input to gate driver circuit 1021 that drives switching amplifier 1022. Although the output currents of gate driver circuit 1021 and switching amplifier 1022 are large, since they are inverter circuits, the output voltage of switching amplifier 1022 is equal to the output voltage of comparator 1020.

The output signal of switching amplifier 1022 is smoothened by inductor element 1050 that serves as low pass filter 1007. Thus, the output signal of inductor element 1050 becomes a signal having the same amplitude as does the original waveform (AM signal).

As a result, digital amplifier 1011 supplies most of the power that linear amplifier 1001 itself cannot supply with high efficiency, whereas analog linear amplifier 1001 compensates a portion that is insufficient in the digital signal. Consequently, an envelope amplifier that has high efficiency (70 to 90%) and high linearity can be realizes.

Since the efficiency of the entire amplifier is decided by the product of the efficiency of the envelope amplifier and the efficiency of the power amplifier itself, the efficiency of the envelope amplifier needs to be as high as possible. In the envelope amplifier shown in FIG. 8, resistor element 1040 is located in an output path of linear amplifier 1001. Thus, the loss of the signal power caused by resistor element 1040 adversely affects the efficiency.

The problem, in which the loss is caused by resistor element 1040, can be theoretically solved by decreasing the resistance of resistor element 1040. However, since the resistance required for resistor element 1040 becomes 1Ω or below, occasionally, 0.1Ω or below, it was difficult to lower the resistance to 1Ω or below because of a problem, in which the ease of design deteriorates, that will be described later.

Techniques that solve the problem in which a loss caused by resistor element 1040 have been proposed in Non-Patent Literature 1 and Non-Patent Literature 2.

FIG. 9 is a schematic diagram describing the technique that is presented in Non-Patent Literature 1.

In the technique presented in Non-Patent Literature 1, the last stage class AB amplifier that composes linear amplifier 1001 is divided into two class AB amplifiers 1023 and 1024. The earlier stage amplifier that composes linear amplifier 1001 (OTA (Operational Transconductance Amplifier)) 1025 is shared by amplifiers 1023 and 1024.

The ratio of gate widths of class AB amplifiers 1023 and 1024 in N:1 (N>>1) and the ratio of output currents thereof are N:1.

A first output signal of linear amplifier 1001 (an output signal of class AB amplifier 1023) is not input to power supply terminal 1003a through a resistor element and is also used as a feedback to linear amplifier 1001.

Since current that flows in class AB amplifier 1023 is larger than the current that flows in class AB amplifier 1024, the operation of class AB amplifier 1023 that depends on a feedback decides the operation of class AB amplifier 1024 that uses the same gate terminal as does class AB amplifier 1023. Thus, class AB amplifier 1024 operates similarly as does class AB amplifier 1023.

A second output signal of linear amplifier 1001 (an output signal of class AB amplifier 1024 is input to comparator 1020 through current-to-voltage conversion circuit 1026. The input signal is compared with a reference potential that is applied at terminal 1027 and the compared result is output as an output signal of the digital amplifier to power supply terminal 1003a.

FIG. 10 is a schematic diagram describing the technique presented in Non-Patent Literature 2.

In the technique presented in Non-Patent Literature 2, two linear amplifiers 1001 and 1010 are used. An output terminal of one linear amplifier 1001 is connected to power supply terminal 1003a. Comparator 1020 compares an output signal of linear amplifier 1001 with an output signal of linear amplifier 1010. An output terminal of comparator 1020 is connected to power supply terminal 1003a through gate driver 1021, switching amplifier 1022, and inductor element 1050 that serves as a low pass filter.

Since an output terminal of linear amplifier 1010 is connected only to an input terminal of comparator 1020 and a feedback terminal of linear amplifier 1010, the output terminal is connected in a high impedance state. On the other hand, an output terminal of linear amplifier 1001 is connected to an output terminal of a digital amplifying section. Thus, the output signal of linear amplifier 1001 is affected by an output signal of the digital amplifying section.

By comparing the output signal of linear amplifier 1010 with the output signal of linear amplifier 1001, the amplifier shown in FIG. 10 operates similarly to the circuit shown in FIG. 8.

RELATED ART LITERATURE

Non-Patent Literature

Non-Patent Literature 1: International Microwave Symposium 2009 Digest, pp 413-416 (IMS 2009 WE1A-1), Title: "A 45/46/34% PAE Linear Polar Transmitter for EDGE/WCDMA/Mobile-WiMax," Author: Jinsung Choi et al., Membership: POSTECH, Korea Non-Patent Literature 2: IEEE Radio Frequency Integrated Circuit Symposium 2009 Digest, pp 141-144 (RFIC 2009 RMO2C-1), Title: "A Hybrid Envelope Modulator Using Feedforward Control for OFDM WLAN Polar Transmitter," Author: Chili-Chang Lee et al., Membership: STC, ITRI, Taiwan

SUMMARY OF THE INVENTION

Problem to be Solved by the Invention

The envelope amplifier for the ET type amplifier according to the related art shown in FIGS. 6 to 8 has a problem as regards a bad efficiency due to a loss caused by resistor element 1040 located in the output path. Although this problem can be theoritically solved by lowering the resistance of resistor element 1040, the resistance required for resistor element 1040 is in the order of 1Ω or less, occasionally, 0.1Ω or less. Thus, this solution is not practical because of the following three points.

The first point is a problem regarding the semiconductor manufacturing process. Semiconductors such as poly-silicon used for resistor elements have resistivities in the order of several hundred Ω·square. Thus, to manufacture resistors having a resistivity of 1Ω using these semiconductors, the ratio of the length and width of the resistors needs to be 1 to several hundreds. This results in an increase of the area of the resistor and deterioration of characteristics caused by a parasitic element due to the increase of the area. In addition, the characteristics of resistor elements having a low resistance tend to fluctuate more than do those having a high resistance.

The second point is a problem about design. When the resistance of resistor element 1040 is low, the parasitic resistance that occurs in a line that connects inductor element 1050 and linear amplifier 1001 through resistor element 1040 needs to be sufficiently lower than the resistance of resistor element 1040. However, it is very difficult to lower the wiring resistance of resistor element 1040 to the required resistance, 0.1 to 1Ω or below and thereby circuit design accuracies deteriorate.

The third point is a problem about design accuracies of comparator 1020. When the resistance of resistor element 1040 is low, the potential difference at the input terminal of comparator 1020 is low. Thus, comparator 1020 needs to have very high accuracy. Generally, comparators have hysteresis characteristics so as to prevent them from being affected by noise and so forth (refer to FIG. 11). Thus, when the potential difference at the input terminal is low, the hysteresis width also becomes low and thereby the noise robust also lowers. Depending on circuit structures of comparators, hysteresis width 1209 increases as the frequency increases due to a delay in the circuit (refer to FIG. 12). Thus, it was impossible to lower the resistance of resistor element 1040.

Although techniques that solve the problem about resistor elements are presented in Non-Patent Literature 1 and Non-Patent Literature 2, these techniques also have several problems.

The technique presented in Non-Patent Literature 1 has a problem about whether the operations of two class AB amplifiers 1023 and 1024 completely follow each other. Current-to-voltage conversion circuit 1026 is a circuit composed of one resistor element 1044 as shown in FIG. 13. To suppress current consumption, resistor element 1044 needs to have a resistance in the order of several hundred kΩ. The increased resistance causes a problem about intrinsic capacitance and time constant of the FET and thereby the operation for a high speed signal becomes unstable.

Since the technique presented in Non-Patent Literature 2 requires two linear amplifiers, the problem of power consumption occurs. Although linear amplifier 1010 is loaded with a high impedance, the current consumption cannot be sufficiently suppressed. This means that linear amplifier 1010 suppresses current consumption so as to improve the efficiency of the envelope amplifier. In addition, depending on the drive performances of the linear amplifier and the switching amplifier, the hysteresis width required for comparator 1020 becomes too small and thereby comparator 1020 may not follow the speed of the signal.

As described above, the related art had a problem as regards the decrease of efficiency due to a loss caused by a resistor element located in the output path. Although this problem can be solved by decreasing the resistance, the ease of design significantly deteriorates. The technique in which a resistor element is not used has a problem as regards power consumption and a problem concerning the deterioration of the ease of design such as poor circuit response ho a high speed signal.

An object of the present invention is to provide an amplifying device that can solve the foregoing problems.

Means that Solve the Problem

An amplifying device according to the present invention is an amplifying device comprising: an amplifier that amplifies an input signal; and an output unit that supplies an output signal that is adjusted corresponding to an envelope signal of said input signal to a power supply terminal,
wherein said output unit includes:
an analog amplifying circuit that amplifies said envelope signal;
a digital circuit that selectively outputs a first voltage or a second voltage that is lower than said first voltage; and
first and second output circuits that accept an output signal of said analog amplifying circuit and an output signal of said digital circuit,
wherein said first output circuit includes:
a first integrating circuit that integrates an output signal of said digital circuit; and
a combining section that combines an output signal of said first integrating circuit and an output signal of said analog amplifying circuit and outputs the combined signal to a power supply terminal of said amplifier,
wherein said second output circuit includes:
a second integrating circuit that integrates the output signal of said digital circuit, said second integrating circuit having an impedance higher than said first integrating circuit;
a resistor having two ends, one end being connected to an output terminal of said second integrating circuit, the other end being connected to an output terminal of said analog amplifying circuit, and
a load connected to the output terminal of said second integrating circuit, and
wherein said digital circuit outputs said first voltage in a first state where a voltage applied at the one end of said resistor is lower than the voltage applied at the other end of said resistor and said digital circuit outputs said second voltage in a second state where the voltage applied at the one end of said resistor is higher than the voltage applied at the other end of said resistor.

Effect of the Invention

According to the present invention, the efficiency of the amplifying device can be improved.

BEST MODES THAT CARRY OUT THE INVENTION

Next, with reference to the accompanying drawings, exemplary embodiments of the present invention will be described.

First Exemplary Embodiment

Figure 14:
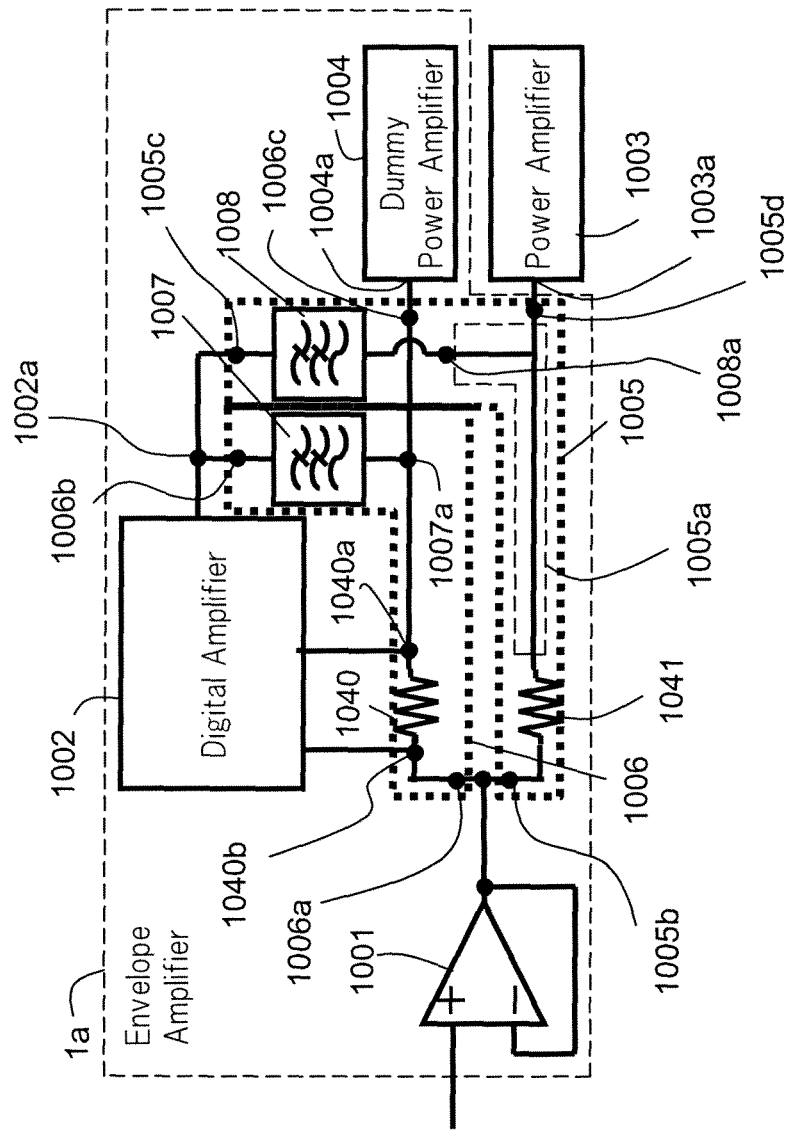
FIG. 14 is a block diagram showing a structure according to a first exemplary embodiment of the present invention.

FIG. 14 is a block diagram showing an amplifying device according to a first exemplary embodiment of the present invention.

In FIG. 14, amplifying device 1 includes envelope amplifier 1a and power amplifier 1003.

Envelope amplifier 1a includes analog linear amplifier 1001, digital amplifier 1002, output circuit 1005, and output circuit 1006.

Output circuit 1005 includes low pass filter 1008, resistor 1041, combining section 1005a, analog input terminal 1005b, digital input terminal 1005c, and output terminal 1005d.

Output circuit 1006 includes low pass filter 1007, resistor 1040, dummy power amplifier 1004, analog input terminal 1006a, digital input terminal 1006b, and output terminal 1006c. In FIG. 14, although dummy power amplifier 1004 is shown independently from output circuit 1006, as described above, dummy power amplifier 1004 is included in output circuit 1006.

Power amplifier 1003 can be generally referred to as the amplifier. Power amplifier 1003 has power supply terminal 1003a and amplifies an input signal (hereinafter referred to as "input signal of the amplifier").

Envelope amplifier 1a can be generally referred to as the output unit. Envelope amplifier 1a supplies a signal adjusted corresponding to an envelope signal of the input signal of the amplifier (hereinafter referred to as "the AM signal") to power supply terminal 1003a.

Analog linear amplifier 1001 can be generally referred to as the analog amplifying device. Analog linear amplifier 1001 is for example an analog linear amplifier that linearly amplifies the AM signal. Analog linear amplifier 1001 accepts the AM signal and amplifies it. An output signal of analog linear amplifier 1001 is branched to two paths: the output signal is input to analog input terminal 1005b through one path and to analog input terminal 1006a through another path.

Digital amplifier 1002 can be generally referred to as the digital circuit. Digital amplifier 1002 selectively outputs a first voltage and a second voltage. The second voltage is lower than the first voltage. An output signal of digital amplifier 1002 is branched to two paths: the output signal is input to digital input terminal 1005c through one path and to digital input terminal 1006b through another path.

Output circuit 1005 can be generally referred to as the first output circuit. Output circuit 1005 accepts the output signal of analog linear amplifier 1001 through analog input terminal 1005b and the output signal of digital amplifier 1002 through digital input terminal 1005c. Analog input terminal 1005b can be generally referred to as the first analog terminal. Digital input terminal 1005c can be generally referred to as the first digital terminal.

Low pass filter 1008 can be generally referred to as the first integrating circuit. Low pass filter 1008 integrates the output signal of digital amplifier 1002 accepted through digital input terminal 1005c.

Resistor 1041 can be generally referred to as the resistor element. Resistor 1041 is connected between analog input terminal 1005b and combining section 1005a.

Combining section 1005a combines an output signal of low pass filter 1008 and the output signal of analog linear amplifier 1001 accepted through analog input terminal 1005b and outputs the combined signal to power supply terminal 1003a of power amplifier 1003.

Output circuit 1006 can be generally referred to as the second output circuit. Output circuit 1006 accepts the output signal of analog linear amplifier 1001 through analog input terminal 1006a and the output signal of digital amplifier 1002 through digital input terminal 1006b. Analog input terminal 1006a can be generally referred to as the second analog terminal. Digital input terminal 1006b can be generally referred to as the second digital terminal.

Low pass filter 1007 can be generally referred to as the second integrating circuit. Low pass filter 1007 integrates the output signal of digital amplifier 1002 through digital input terminal 1006b.

First end 1040a of resistor 1040 is connected to output terminal 1007a of low pass filter 1007, whereas second end 1040b of resistor 1040 is connected to analog input terminal 1006a.

Dummy power amplifier 1004 can be generally referred to as the load or dummy amplifier. Dummy power amplifier 1004 is connected to output terminal 1007a of low pass filter 1007.

Digital amplifier 1002 detects a voltage applied at resistor 1040 and selectively outputs the first voltage or the second voltage depending on the detected voltage.

According to this exemplary embodiment, digital amplifier 1002 outputs the first voltage in a first state where the voltage applied at first end 1040a of resistor 1040 is lower than the voltage applied at second end 1040b of resistor 1040; and digital amplifier 1002 outputs the second voltage in a second state where the voltage applied at first end 1040a of resistor 1040 is higher than the voltage applied at second end 1040b of resistor 1040.

In this example, output circuit 1005 is referred to as the first path, whereas the circuit excluding dummy power amplifier 1004 from output circuit 1006 is referred to as the second path.

In the first path, the output signal of analog linear amplifier 1001 is supplied to power supply terminal 1003a of power amplifier 1003 through resistor element 1041. In the second path, the output signal of analog linear amplifier 1001 is supplied to power supply terminal 1004a of dummy power amplifier 1004 through resistor 1040.

Terminals at both ends of resistor 1040 located in the second path is also used as input terminals of digital amplifier 1002.

Output terminal 1002a of digital amplifier 1002 is connected to low pass filters 1007 and 1008. Output terminal 1007a of low pass filter 1007 is connected to power supply terminal 1004a of dummy power amplifier 1004. Output terminal 1008a of low pass filter 1008 is connected to power supply terminal 1003a of power amplifier 1003.

Assuming that second end 1040b of resistor 1040 is referred to as the first terminal and first end 1040a of resistor 1040 is referred to as the second terminal, digital amplifier 1002 compares the potential applied at the first terminal with the potential applied at the second terminal, outputs a signal that represents "high" (first voltage) when the potential applied at the first terminal is higher than the potential applied at the second terminal and outputs a signal that represents "low" (second voltage) when the potential applied at the second terminal is higher than the potential applied at the first terminal.

In amplifying device 1 shown in FIG. 14, the structure of the second path is the same as the structure of the first path except that impedances of elements that compose their circuits differ from each other. The impedance of the element that composes the second path is N times (N>>1) higher than the impedance of the element that composes the first path.

Figure 15:
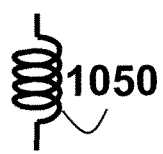
FIG. 15 is a schematic diagram showing an example of a structure of a low pass filter.

FIG. 15 is a schematic diagram showing inductor element 1050 that can be used as low pass filters 1007 and 1008. When inductor element 1050 is used as low pass filters 1007 and 1008, the impedance of the inductor element used as low pass filter 1007 is set to N times higher than the impedance of the inductor element used as low pass filter 1008.

Dummy power amplifier 1004 is a circuit that has an impedance N times higher than power amplifier 1003. In other words, the impedance of dummy power amplifier 1004 is higher than the impedance of power amplifier 1003.

In amplifying device 1, the impedance viewed from analog input terminal 1005*b* to output circuit 1005 is lower than the impedance viewed from analog input terminal 1006*a* to output circuit 1006, whereas the impedance viewed from digital input terminal 1005*c* to output circuit 1005 is lower than the impedance viewed from digital input terminal 1006*b* to output circuit 1006.

Next, with reference to FIG. 14, the operation of the first exemplary embodiment will be described.

In amplifying device 1, the output signal of analog linear amplifier 1001 is branched to two paths: the output signal is input to the first path (analog input terminal 1005*b*) and to the second path (analog input terminal 1006*a*). The first path is a path through which the output signal of analog linear amplifier 1001 is supplied to power amplifier 1003. The second path is a path through which a feedback to digital amplifier 1002 is decided.

The path that has digital amplifier 1002 and low pass filter 1007 forms a feedback loop.

Digital amplifier 1002 outputs a pulse waveform signal in which the input signal has been pulse-width modulated. The pulse waveform signal is supplied to low pass filter 1007. Low pass filter 1007 outputs an original waveform signal.

A voltage corresponding to the output signal of low pass filter 1007 is applied at first end 1040*a* of resistor 1040, whereas a voltage corresponding to the output signal of analog linear amplifier 1001 is applied at second end 1040*b* of resistor 1040. Digital amplifier 1002 decides the pulse-width modulation corresponding to the voltage applied at both ends of resistor 1040.

Since the second path has an impedance that is N times higher than the first path, the current that flows in the first path is N times higher than the current that flows in the second path. In addition, the potential at the node in the first path, which corresponds to the corresponding node in the second path, is equal to the potential at the corresponding node in the second path. Thus, the operation in the first path where there is no feedback loop is the same as the operation in the second path where there is a feedback loop.

In envelope amplifier 1*a*, resistor element 1041 located in the first path has a resistance as low as 0.1Ω to 1Ω, whereas resistor 1040 located in the second path has a resistance N times higher than resistor element 1041.

Since resistor 1040 located in the second path is a resistor that decides a feedback to digital amplifier 1002, the fluctuations of the resistance of resistor 1040 affect the performance of digital amplifier 1002.

Figure 6:
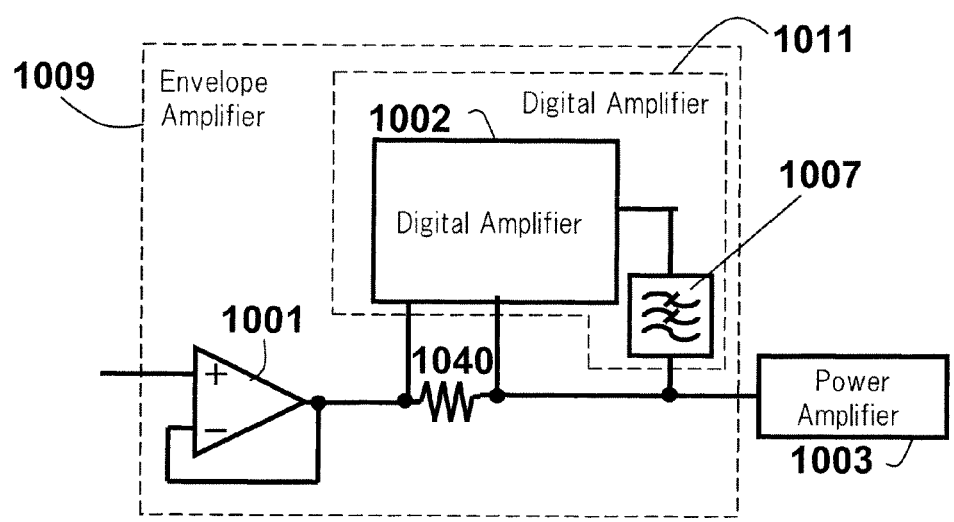
FIG. 6 is a block diagram showing a structure of an envelope amplifier of an ET amplifier according to the related art.

However, the resistance of resistor 1040 of the amplifying device according to this exemplary embodiment is N times higher than the resistance of resistor 1040 of the amplifying device according to the related art shown in FIG. 6.

According to this exemplary embodiment, manufacturing process accuracies and design accuracies can be improved for which the resistance of resistor 1040 can be increased.

In addition, according to this exemplary embodiment, since the resistance of resistor element 1041 located in the first path can be remarkably decreased, the resistance of resistor element 1041 can be lower than the impedance of the other element (low pass filter 1008) located in the first path.

As the operation of envelope amplifier 1*a*, since the current that flows from digital amplifier 1002 is a main component of the output current because of improvement of efficiency, it occurs that "current that flows from analog linear amplifier 1001<<current that flows from digital amplifier 1002", and thereby fluctuations of the resistance of resistor element 1041 hardly affect the operation of the first path.

From the foregoing reason, if the ratio of the impedances of the first path and the impedance of the second path is small, the operation of the first path may be affected. However, if N is sufficiently large (for example, N=100 to 1000), the operation of the first path is not affected.

The advantages of the ease of design of his circuit have been described.

With respect to efficiency, the resistance of the resistor located in the first path can be decreased compared to the amplifier according to the related art shown in FIG. 6 without taking account of the ease of design. As a result, it can be expected that the efficiency of amplifying device 1 according to this exemplary embodiment can be improved by several % compared to the amplifying device according to the related art shown in FIG. 6. On the other hand, the current consumed in the second path, not directly output to power amplifier 1003, is 1/(N+1) of the whole current. Assuming that N=100, the current consumed in the second path is 1/101 of the whole current, namely the decrease of the efficiency of the envelope amplifier itself, is around 1%. On the other hand, assuming that N=1000, the decrease of the efficiency of the envelope amplifier is around 0.1%. Thus, as described above, since the efficiency improves by several % and also deteriorates by 0.1 to 1%, the efficiency improves as a whole.

Next, the effect of this exemplary embodiment will be described.

Envelope amplifier 1*a* has two paths: one path formed by output circuit 1005 and the other path formed by output circuit 1006. The resistance of resistor 1040 located in output circuit 1006 is higher than the resistance of resistor element 1041 located in output circuit 1005 such that the impedance of the path formed by output circuit 1006 is higher than the impedance of the path formed by output circuit 1005. Thus, in the following description, the path formed by output circuit 1006 is referred to as the high impedance path, whereas the path formed by output circuit 1005 is referred to as the low impedance path.

Figure 7:
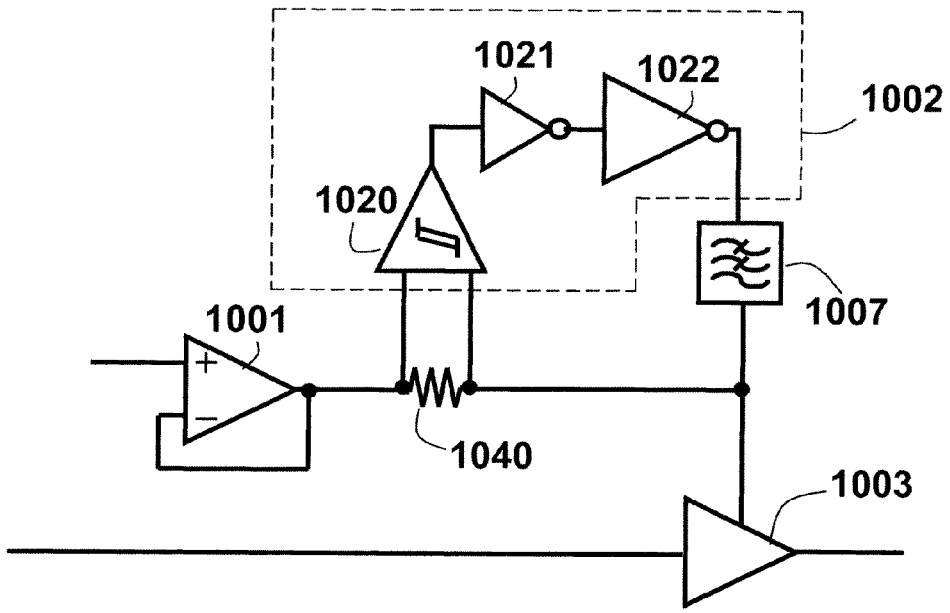
FIG. 7 is a block diagram showing a structure of an envelope amplifier of an ET amplifier according to the related art.
Figure 8:
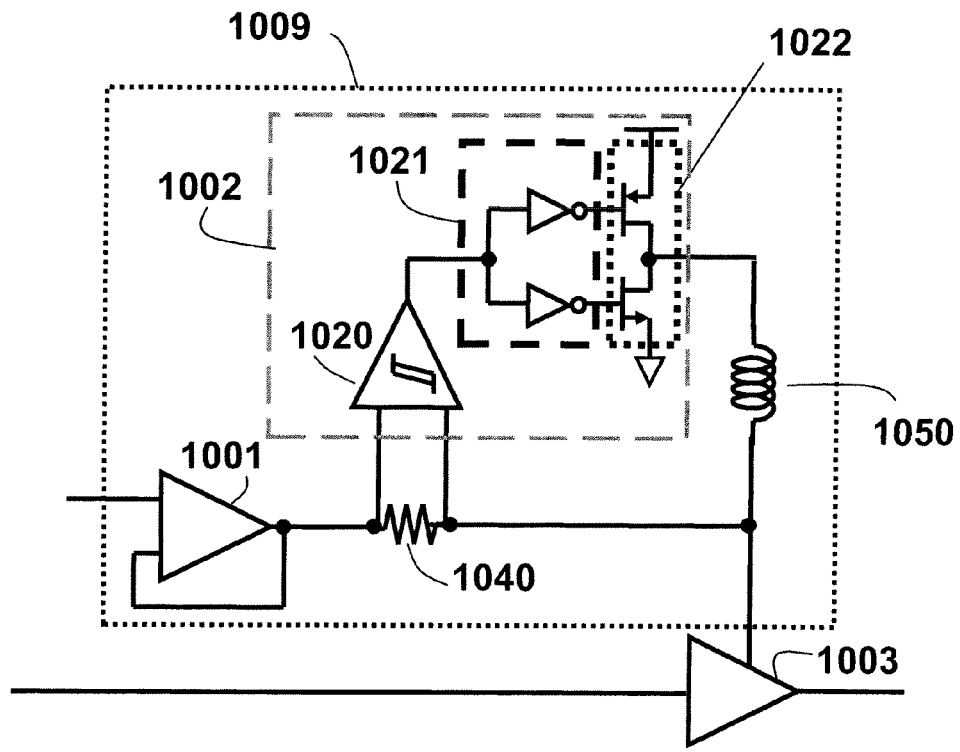
FIG. 8 is a block diagram showing a structure of an envelope amplifier of an ET amplifier according to the related art.
Figure 9:
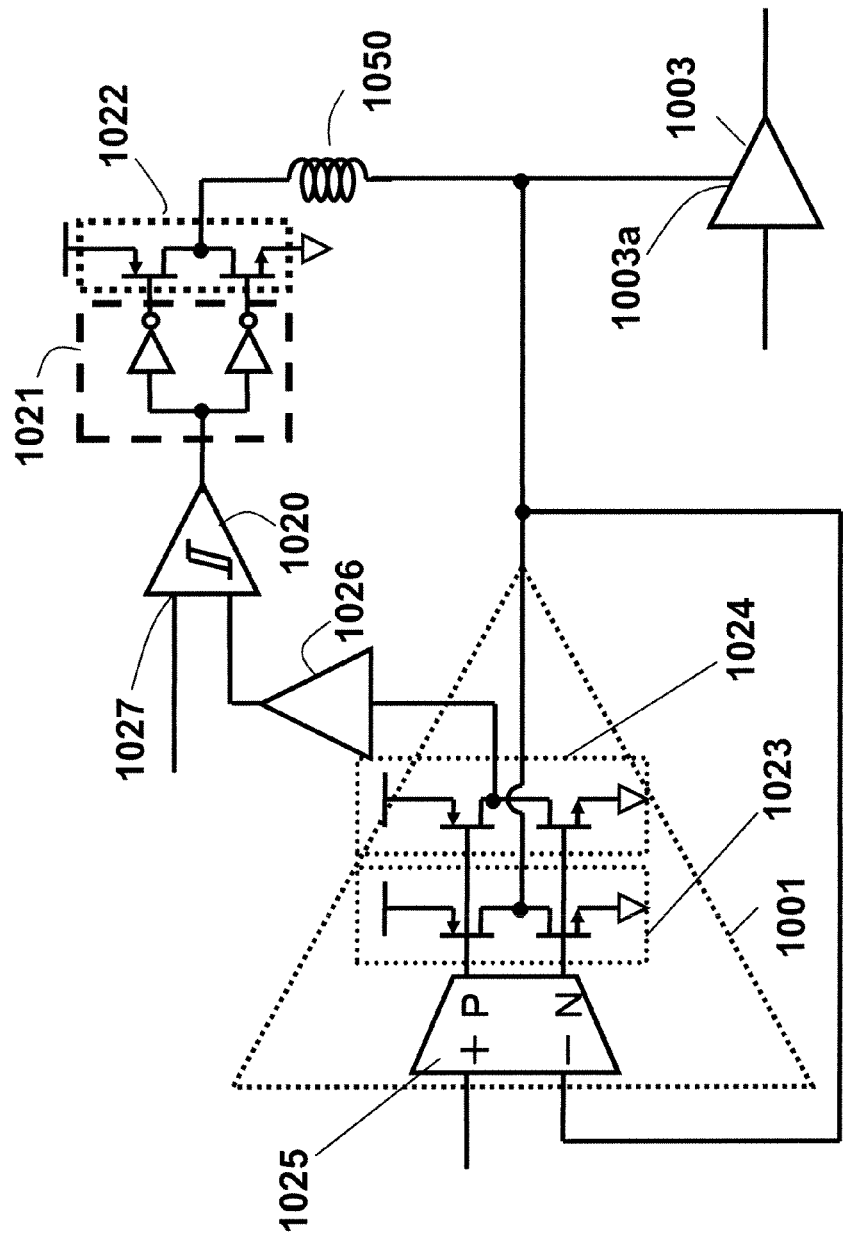
FIG. 9 is a schematic diagram showing a structure according to the related art.
Figure 10:
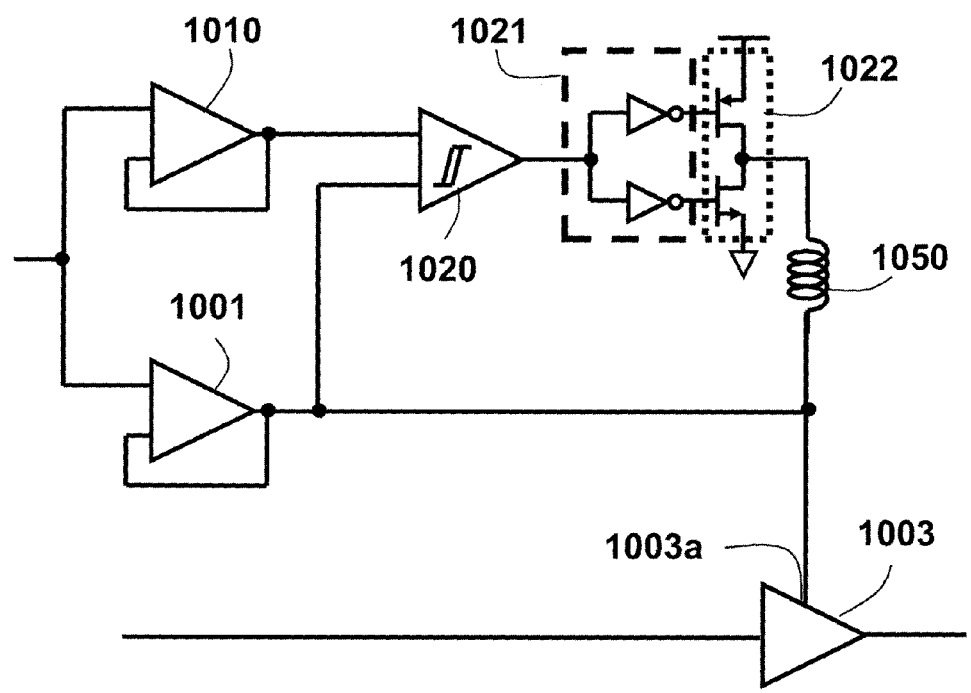
FIG. 10 is a schematic diagram showing a structure according to the related art.
Figure 11:
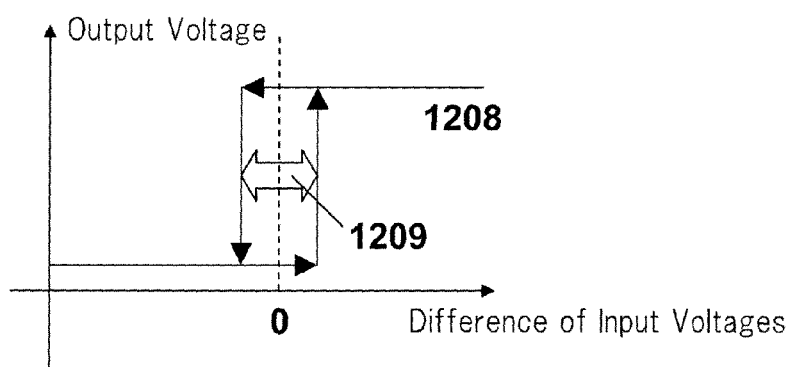
FIG. 11 is a schematic diagram showing input and output characteristics of a comparator.
Figure 12:
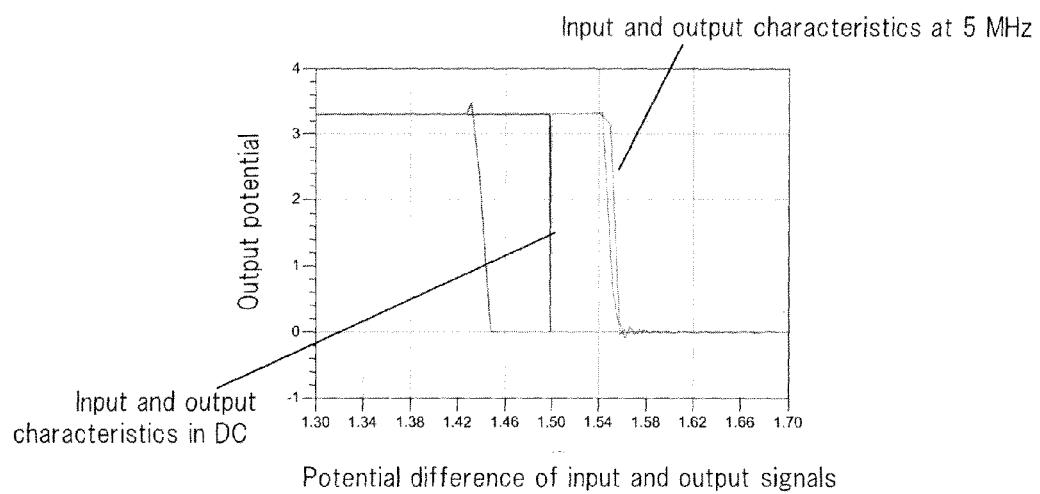
FIG. 12 is a schematic diagram showing changes of input and output characteristics of a comparator with respect to frequencies.
Figure 13:
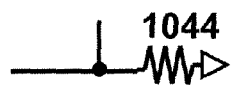
FIG. 13 is an example of a current-to-voltage conversion circuit according to the related art.

The high impedance path is equivalent to the structure in which the resistance of resistor 1040 according to the related art shown in FIGS. 6 to 8 is increased. Thus, this path decides the operation of digital amplifier 1002. On the other hand, the signal that is output to power supply terminal 1003*a* of power amplifier 1003 passes through the low impedance path. Since the resistance of resistor element 1041 located in the low impedance path is lower than the resistance of resistor 1040, the efficiency of amplifying device improves.

According to this exemplary embodiment, the ratio of impedances of the high impedance path and the low impedance path is N:1 (N>>1), the action of the current in each path is about the same except that the ratio of the current that flows in the high impedance path and the current that flows in the low impedance path is 1:N. Assuming that N=100, the current that flows in the high impedance path is 1/101 of the whole current; assuming that N=1000, the current that flows in the high impedance path is 1/1001 of the whole current. Thus, the increase of the current consumption in the added circuit portion of the circuit according to the related art is around 1% when N=100; around 0.1% when N=1000. Consequently, the increase of the current consumption does not adversely affect the efficiency of the amplifying device.

Since the high impedance path is different from the low impedance path only in their impedances, although the former has a large loss for passage of a signal, the impedance of the high impedance path is at most N times higher than that of the low impedance path. Thus, even if N=1000, the impedance of the high impedance path is at most several k Ω. Consequently, the amplifying device according to this exemplary embodiment hardly has a problem as regards time constant unlike the structure in Non-Patent Literature 1.

Second Exemplary Embodiment

Figure 16:
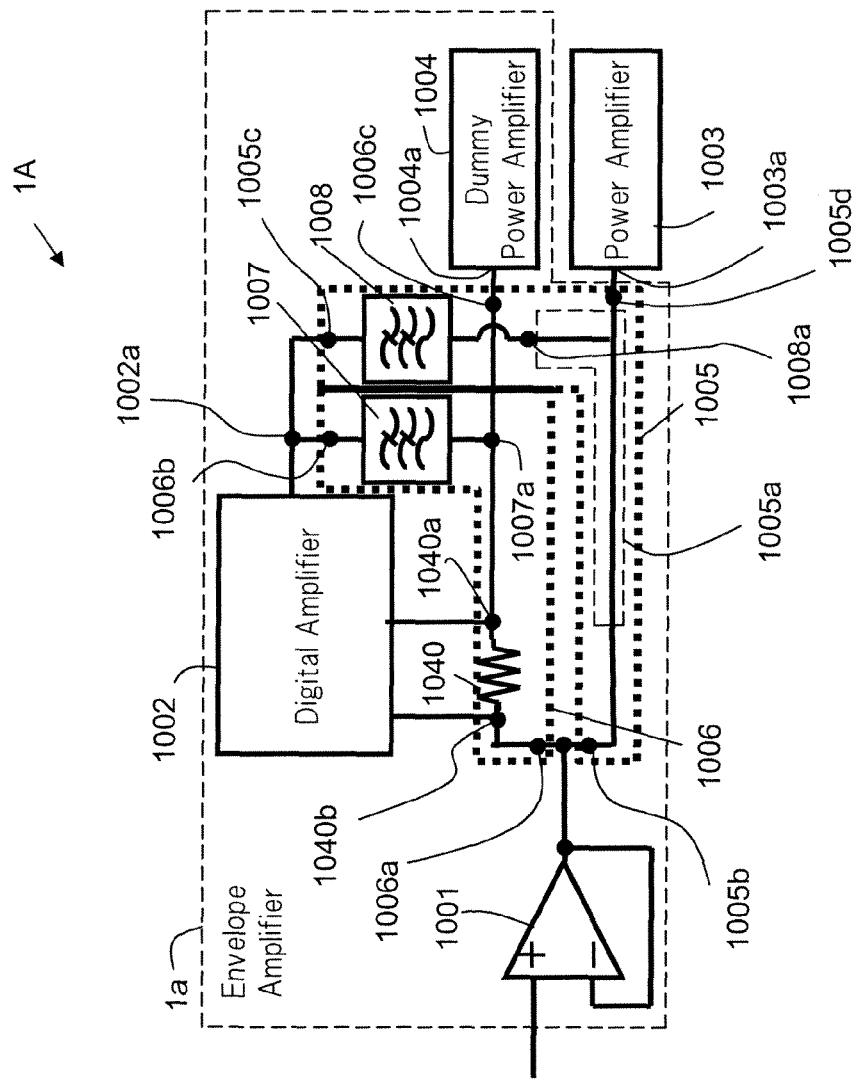
FIG. 16 is a block diagram showing a structure according to a second exemplary embodiment of the present invention.

FIG. 16 is a block diagram showing amplifying device 1A according to a second exemplary embodiment of the present invention. In FIG. 6, constituent sections similar to those in FIG. 14 are denoted by similar reference numerals.

Amplifying device 1A shown in FIG. 16 has a structure in which both ends of resistor 1041 located in amplifying device 1 shown in FIG. 14 are short-circuited. Thus, in the first path formed in amplifying device 1A, an output signal of analog linear amplifier 1001 is supplied to power supply terminal 1003a of power amplifier 1003 through combining section 1005a.

In amplifying device 1A shown in FIG. 16, the structure of the second path is the same as the structure of the first path except that their impedances are different and except that the second path has resistor 1040. According to this exemplary embodiment, the impedance of the element that composes the second path is N times (N>>1) higher than the impedance of the element that composes the first path.

Next, with reference to FIG. 16, the operation of the second exemplary embodiment will be described.

Amplifying device 1A according to the second exemplary embodiment has a structure in which resistor element 1041 of the amplifying device according to the first exemplary embodiment is short-circuited. As described in the first exemplary embodiment, since the output signal passes through resistor element 1041, it has a resistance as low as 0.1Ω to 1Ω. Thus, when the resistance of resistor element 1041 is very low, even if resistor element 1041 is short-circuited, the current that flows in the second path and the operation of the entire circuit are hardly affected. Thus, although amplifying device 1A according to the second exemplary embodiment does not have resistor element 1041, the amplifying device 1A according to the second exemplary embodiment operates similarly as does amplifying device 1 according to the first exemplary embodiment.

Amplifying device 1A according to the second exemplary embodiment has an effect similar to that of amplifying device 1 according to the first exemplary embodiment. In addition, amplifying device 1A according to the second exemplary embodiment neither has a resistor in an output path located between analog linear amplifier 1001 and power supply terminal 1003a of power amplifier 1003 nor requires a device that has a very high resistance or a very low resistance. Thus, amplifying device 1A (more specifically, envelope amplifier 1aA) has the ease of design.

Third Exemplary Embodiment

Figure 17:
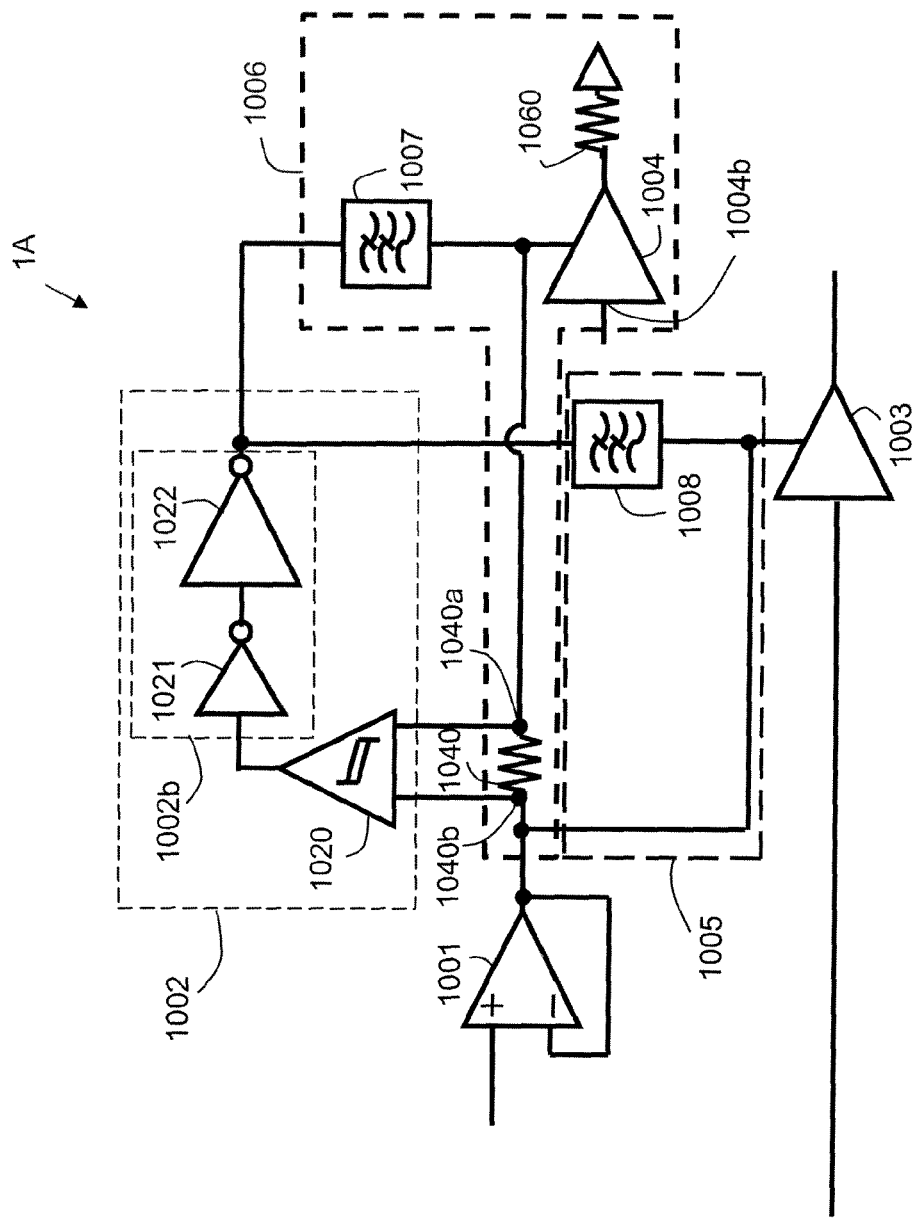
FIG. 17 is a block diagram showing a structure according to a third exemplary embodiment of the present invention.

FIG. 17 is a block diagram showing amplifying device 1A according to a third exemplary embodiment of the present invention. In FIG. 17, constituent sections similar to those shown in FIG. 16 are denoted by similar reference numerals.

In FIG. 17 that shows amplifying device 1A, digital amplifier 1002 and dummy power amplifier 1004 according to the second exemplary embodiment are described in detail. Thus, the characteristics of the amplifying device according to the second exemplary embodiment can be applied to the amplifying device according to the third exemplary embodiment. Alternatively, digital amplifier 1002 shown in FIG. 17 may be used as digital amplifier 1002 located in amplifying device 1 shown in FIG. 14. Further alternatively, dummy power amplifier 1004 and load 1060 shown in FIG. 17 may be used as dummy power amplifier 1004 shown in FIG. 14.

In FIG. 17, digital amplifier 1002 includes comparator 1020 and digital amplifier 1002b. Digital amplifier 1002b includes gate driver circuit 1021 and switching amplifier 1022.

Comparator 1020 compares the voltage applied at first end (second terminal) 1040a of resistor 1040 with the voltage applied at second end (first terminal) 1040b of resistor 1040 and outputs the compared result to digital amplifier 1002.

According to this exemplary embodiment, when the potential applied at the first terminal is higher than the potential applied at the second terminal (in a first state), comparator 1020 outputs a signal that represents "high" (first voltage); when the potential applied at the second terminal is higher than the potential applied at the first terminal (in a second state), comparator 1020 outputs a signal that represents "low" (second voltage).

According to this exemplary embodiment, even if the relationship between the voltage applied at first end 1040a of resistor 1040 and the voltage applied at second end 1040b of resistor 1040 is reversed, if the absolute value of the difference between the voltage applied at first end 1040a of resistor 1040 and the voltage applied at second end 1040b of resistor 1040 does not exceed a predetermined value, comparator 1020 will not change the compared result. When the absolute value exceeds the predetermined value, comparator 1020 changes the compared result.

When the compared result of comparator 1020 represents the first state, digital amplifier 1002b outputs the first voltage; when the compared result of comparator 1020 represents the second state, digital amplifier 1002b outputs the second voltage.

Gate driver circuit 1021 is, for example, an inverter. Switching amplifier 1022 is, for example, an inverter.

Gate driver circuit 1021 is a circuit that drives output switching amplifier 1022 and is composed of, for example, at least one inverter or buffer.

Switching amplifier 1022 amplifies power so as to sufficiently drive power amplifier 1003 and dummy power amplifier 1004.

In FIG. 17, although gate driver circuit 1021 and switching amplifier 1022 are denoted by symbols of inverters, as long as the output signal of switching amplifier 1022 logically matches the output signal of switching amplifier 1022, gate driver circuit 1021 and switching amplifier 1022 may be integrated into one part. Alternatively, as long as power amplifier 1003 and dummy power amplifier 1004 can be sufficiently driven with the output current of comparator 1020, gate driver circuit 1021 and switching amplifier 1022 can be omitted.

Figure 1:
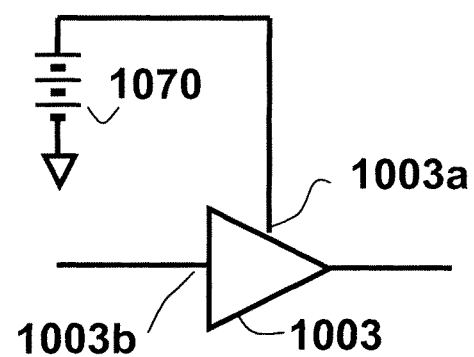
FIG. 1 is a block diagram showing a structure of a class AB amplifier according to the related art.
Figure 2:
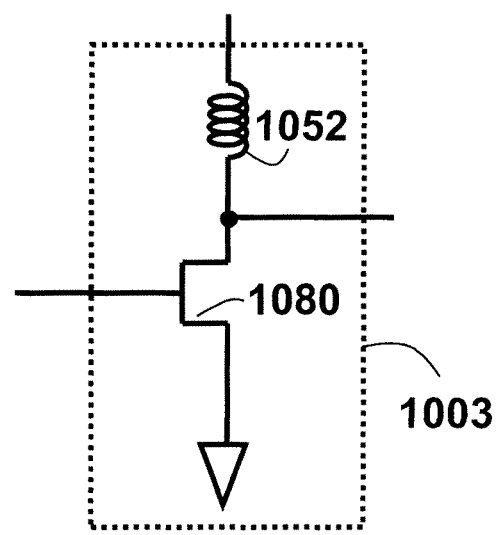
FIG. 2 is a circuit diagram showing an example of a structure of a basic circuit of a power amplifier (excluding a bias circuit and so forth).
Figure 3:
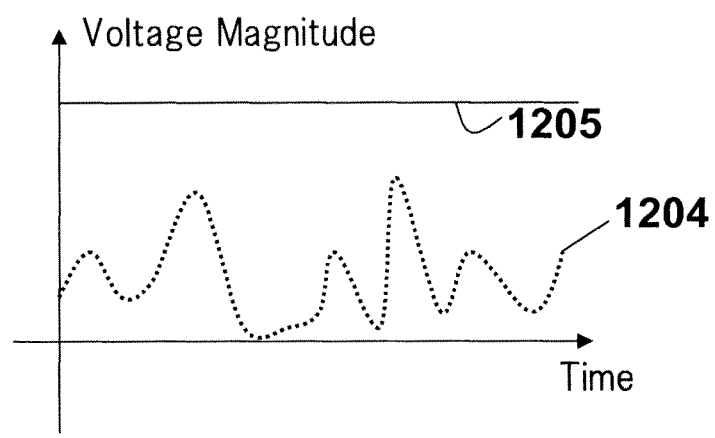
FIG. 3 is a schematic diagram showing chronological changes of an envelope signal that is an input signal to a class AB amplifier and a supply voltage according to the related art.
Figure 4:
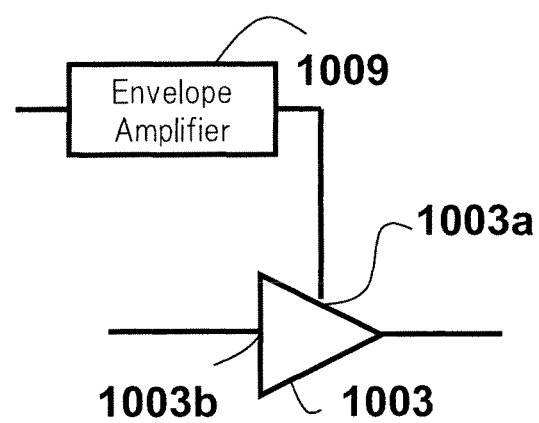
FIG. 4 is a block diagram showing a structure of an ET amplifier according to the related art.
Figure 5:
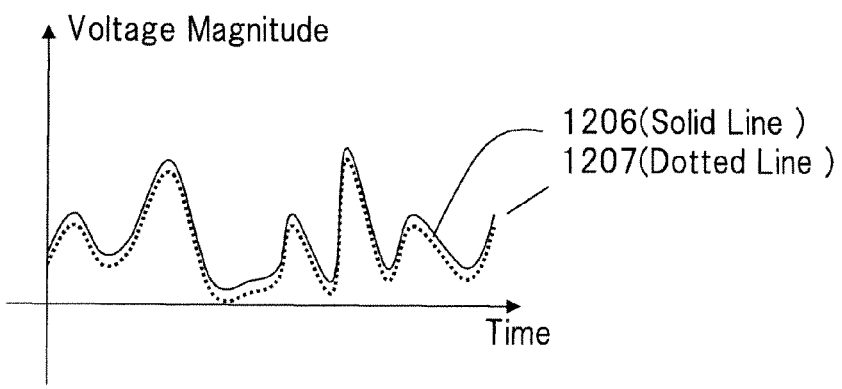
FIG. 5 is a schematic diagram showing chronological changes of an envelope signal that is an input signal to an ET amplifier and a supply voltage according to the related art.

Dummy power amplifier 1004 is a power amplifier that has a size 1/N times smaller than power amplifier 1003. The gate voltage (see FIG. 2) of dummy power amplifier 1004 is the same as that of power amplifier 1003.

Since dummy power amplifier 1004 is provided so as to balance impedances, an input of dummy power amplifier 1004 (input terminal 1004b) may be open, the input signal of dummy power amplifier 1004 may match the input signal of power amplifier 1003 (input signal of the amplifier), or another signal may be input to dummy power amplifier 1004. Load 1060 having an impedance N times higher than the impedance of the output of power amplifier 1003 is connected to the output terminal of dummy power amplifier 1004. Thus, since the second path is a circuit that has an impedance N times higher than the first path, the current that flows in the second path is 1/N times lower than the current that flows in the first path.

Next, with reference to FIG. 17, the operation of the third exemplary embodiment will be described.

The third exemplary embodiment describes digital amplifier 1002, power amplifier 1003, and dummy power amplifier 1004 according to the second exemplary embodiment in detail. Since they does not carry out operation that are different from the operation of the amplifying devices according to the first and second exemplary embodiments, these circuits operate in the same way as do those of amplifying device 1A, according to the second exemplary embodiment.

Fourth Exemplary Embodiment

Figure 18:
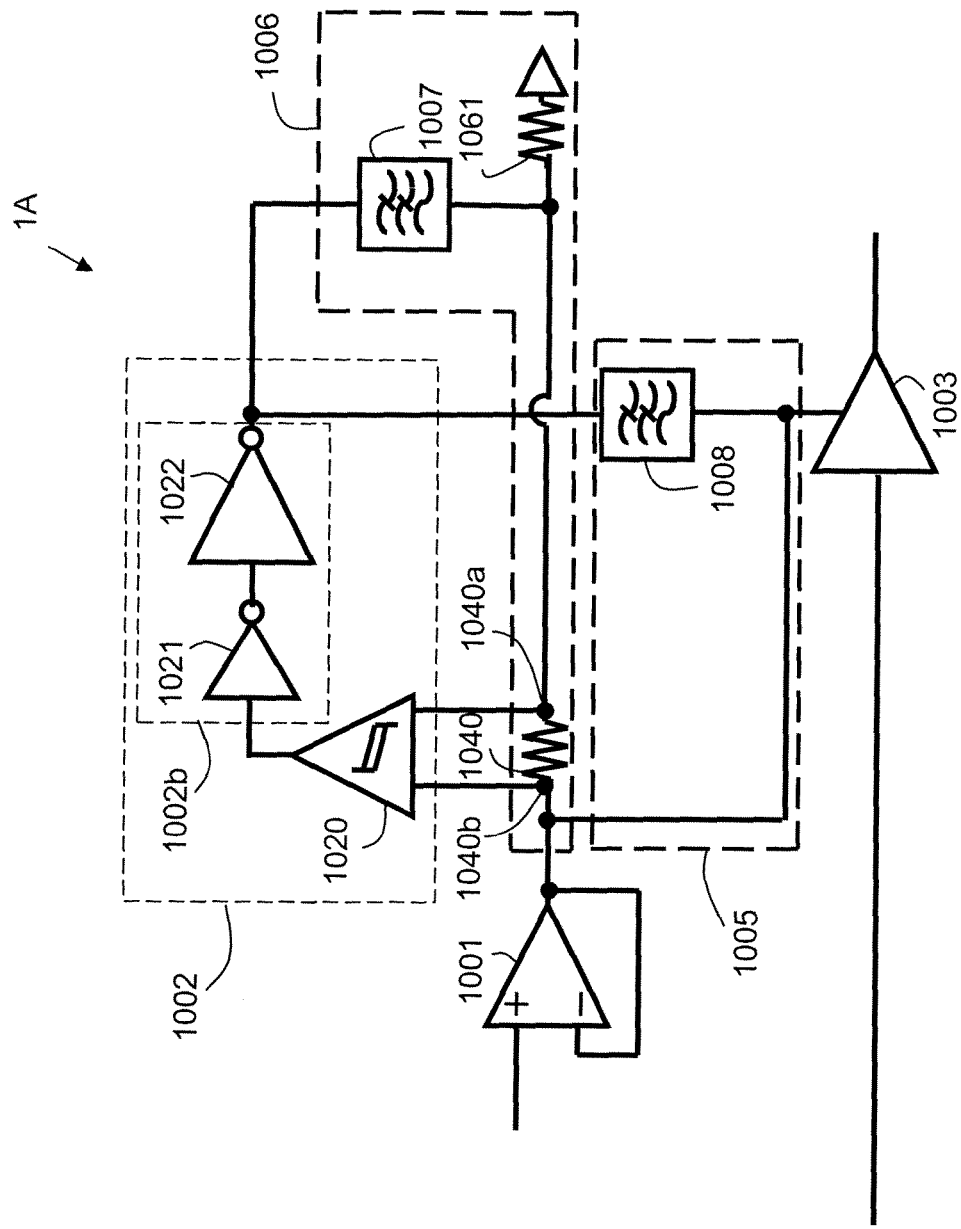
FIG. 18 is a block diagram showing a structure according to a fourth exemplary embodiment of the present invention.

FIG. 18 is a block diagram showing amplifying device 1A according to a fourth exemplary embodiment of the present invention. In FIG. 18, constituent sections similar to those shown in FIG. 17 are denoted by similar reference numerals.

Amplifying device 1A shown in FIG. 18 includes digital amplifier 1002 according to the second exemplary embodiment and load 1061 with which dummy power amplifier 1004 and load 1060 according to the third exemplary embodiment are substituted. Load 1061 can be generally referred to as the load impedance element. The characteristics of amplifying device 1A according to the second and third exemplary embodiments can be applied to the fourth exemplary embodiment except for the dummy power amplifier of amplifying device 1A according to the third exemplary embodiment.

The impedance of load 1061 is equal to impedance viewed from the power supply terminal of dummy power amplifier 1004 to dummy power amplifier 1004 and load 1060 of amplifying device 1A according to the third exemplary embodiment. This means that amplification itself is not significant in the second path, but the ratio of impedance in the first path and impedance in the second path needs to be constant. As a result, amplifying device 1A according to the fourth exemplary embodiment can be miniaturized compared to amplifying device 1A according to the third exemplary embodiment that requires the amplifier circuit that can be small. Thus, the second path becomes a circuit that has an impedance N times higher than the first path and that has a current 1/N times lower than the first path.

Next, with reference to FIG. 18, the operation of amplifying device 1A according to the fourth exemplary embodiment will be described.

In the amplifying device 1A according to the fourth exemplary embodiment, dummy power amplifier 1004 and load 1060 according to the third exemplary embodiment are substituted with load 1061. Thus, as long as the ratio of the impedance in the first pat and the impedance in the second path is kept in the relationship of N:1, as described above, since the amplification operation of dummy power amplifier 1004 is not necessary, amplifying device 1A according to the fourth exemplary embodiment operates in the same way as does the amplifying device 1A according to the third exemplary embodiment.

Fifth Exemplary Embodiment

Figure 19:
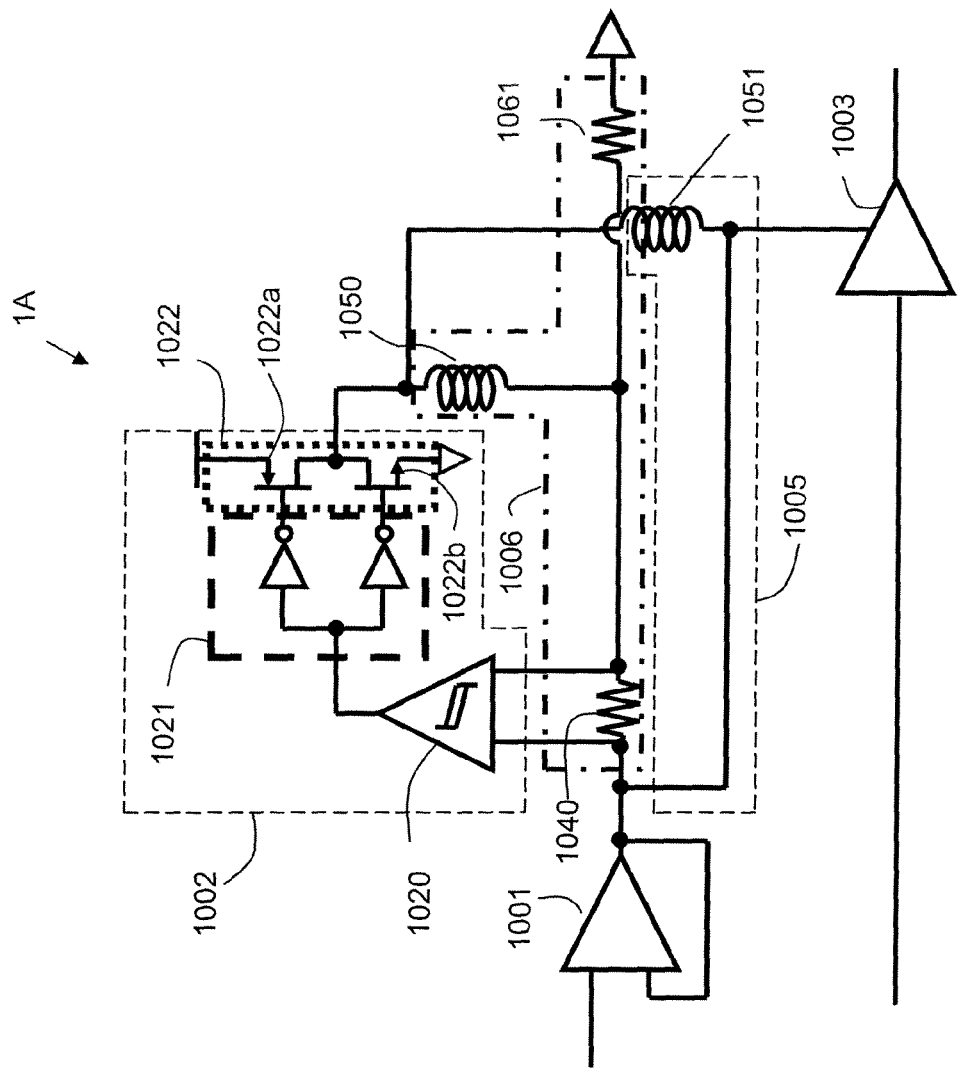
FIG. 19 is a block diagram showing a structure according to a fifth exemplary embodiment of the present invention.

FIG. 19 is a block diagram showing amplifying device 1A according to a fifth exemplary embodiment of the present invention. In FIG. 19, constituent sections similar to those shown in FIG. 18 are denoted by similar reference numerals.

Amplifying device 1A according to the fifth exemplary embodiment shown in FIG. 19 includes an example of gate driver circuit 1021 and an example of switching amplifier 1022 according to the fourth exemplary embodiment and examples of low pass filters 1007 and 1008. Thus, the characteristics of the amplifying device 1A according to the fourth exemplary embodiment can be applied to the fifth exemplary embodiment.

Switching amplifier 1022 includes p-MOS transistor 1022a and n-MOS transistor 1022b. A high potential side voltage of the supply voltage of digital amplifier 1002b is applied as a first voltage at a source terminal and a substrate terminal of p-MOS transistor 1022a. A low potential side voltage of the supply voltage of digital amplifier 1002b is applied as a second voltage at a source terminal and a substrate terminal of n-MOS transistor 1022b. A drain terminal of n-MOS transistor 1022b and a drain terminal of p-MOS transistor 1022a are connected and the individual drain terminals are used as output terminals.

Gate driver circuit 1021 is a circuit that drives output switching amplifier 1022 and is composed of, for example, at least one inverter or buffer.

Gate driver circuit 1021 includes an inverter that turns on p-MOS transistor 1022a and turns off n-MOS transistor 1022b when the compared result of comparator 1020 represents a first state and that turns off p-MOS transistor 1022a and turns on n-MOS transistor 1022b when the compared result of comparator 1020 represents a second state.

FIGS. 20, 21, 22, and 23 are schematic diagrams showing examples of gate driver circuit 1021.

Since switching amplifier 1022 shown in FIG. 19 has two input terminals, FIGS. 20, 21, 22, and 23 show examples of gate driver circuit 1021 that has two output terminals.

Figure 20:
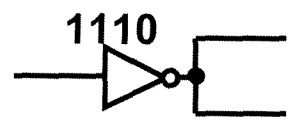
FIG. 20 is a schematic diagram showing an example of a first structure of a gate driver circuit.
Figure 21:
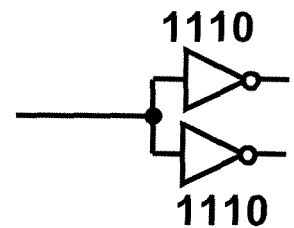
FIG. 21 is a schematic diagram showing an example of a second structure of the gate driver circuit.
Figure 22:
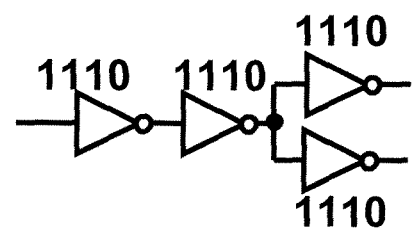
FIG. 22 is a schematic diagram showing an example of a third structure of the gate driver circuit.
Figure 23:
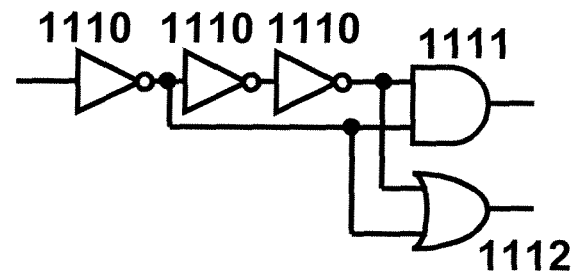
FIG. 23 is a schematic diagram showing an example of a fourth structure of the gate driver circuit.

Gate driver circuit 1021 may be composed of one stage inverter 1110 as shown in FIG. 20 or FIG. 21. Alternatively, gate driver circuit 1021 may be composed of multi-stage inverters 1110.

Alternatively, gate driver circuit 1021 may have a delay circuit that prevents p-MOS transistor 1022a and n-MOS transistor 1022b from simultaneously being turned on and a current from flowing through them.

Figure 24:
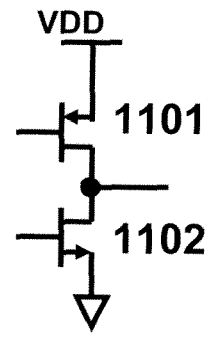
FIG. 24 is a schematic diagram showing an example of a structure of a switching amplifier.
Figure 25:
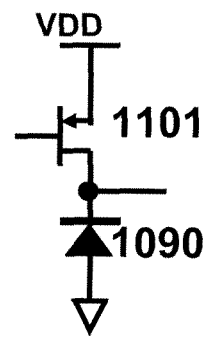
FIG. 25 is a schematic diagram showing an example of a structure of a switching amplifier.

Switching amplifier 1022 amplifies power so as to sufficiently drive power amplifier 1003 and load 1061. FIGS. 24 and 25 show examples of switching amplifier 1022. Switching amplifier 1022 may be a combination of p-MOS transistor 1101 and n-MOS transistor 1102 as shown in FIG. 24. Alternatively, switching amplifier 1022 may be a combination of p-MOS transistor 1101 and diode 1090 as shown in FIG. 25.

Figure 26:
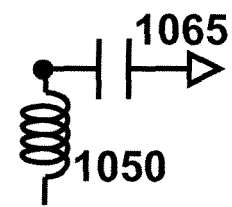
FIG. 26 is a schematic diagram showing an example of a structure of a low pass filter.

Inductor elements 1050 and 1051 are substituted for low pass filters 1007 and 1008 of amplifying device 1A according to the fourth exemplary embodiment (FIG. 18). Alternatively, inductor elements 1050 and 1051 may be substituted with a low pass filter shown in FIG. 26.

Next, with reference to FIG. 19, the operation of amplifying device 1A according to the fifth exemplary embodiment will be described.

Amplifying device 1A according to the fifth exemplary embodiment includes examples of low pass filters 1007 and 1008, an example of gate driver circuit 1021, and an example of switching amplifier 1022 of amplifying device 1A according to the fourth exemplary embodiment. Since these substituted examples do not have special operations, amplifying device 1A according to the fifth exemplary embodiment operates as does amplifying device 1A according to the fourth exemplary embodiment.

Sixth Exemplary Embodiment

Figure 27:
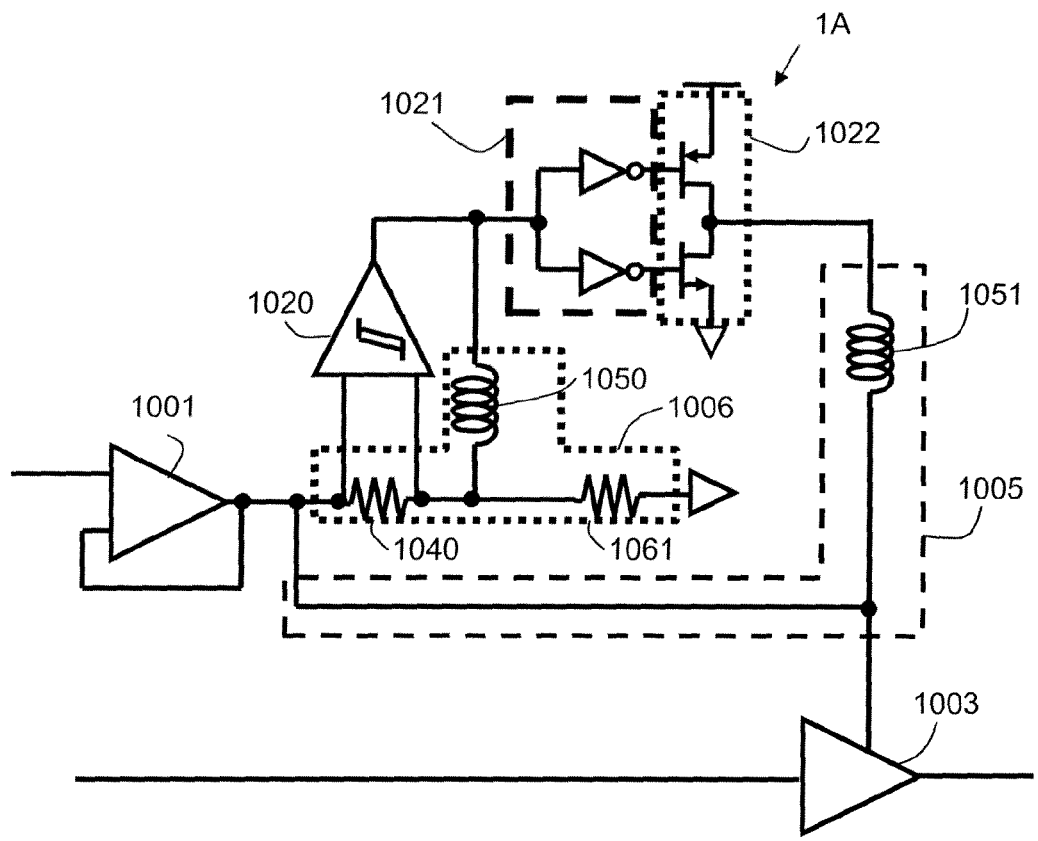
FIG. 27 is a block diagram showing a structure according to a sixth exemplary embodiment of the present invention.

FIG. 27 is a block diagram showing amplifying device 1A according to a sixth exemplary embodiment of the present invention. In FIG. 27, constituent sections similar to those shown in FIG. 19 are denoted by similar reference numerals.

In amplifying device 1A shown in FIG. 27, the feedback path of amplifying device 1A according to the fifth exemplary embodiment is obtained not from the output terminal of switching amplifier 1022, but from the output terminal of comparator 1020. Specifically, in amplifying device 1A shown in FIG. 27, one end of inductor element 1050 is connected to the output terminal of comparator 1020 and the other end of inductor element 1050 is connected to first end 1040*a* of resistor 1040 and load 1061.

Next, with reference to FIG. 27, the operation of amplifying device 1A according to the sixth exemplary embodiment will be described.

Amplifying device 1A according to the sixth exemplary embodiment has a structure in which the feedback path using inductor element 1050 according to the fifth exemplary embodiment is changed. However, since output signals of switching amplifier 1022 and comparator 1020 of amplifying device 1A according to the sixth exemplary embodiment are logically the same as those according to the fifth exemplary embodiment except that former output signals have delays, amplifying device 1A according to the sixth exemplary embodiment operates in the same way as does amplifying device 1A according to the fifth exemplary embodiment.

Switching amplifier 1022 is provided so as to supply a large current to a low impedance element such as power amplifier 1003. However, the second path has an impedance N times higher than the first path. When N is sufficiently large, the impedance of the second path becomes large and thereby current that flows in the second path decreases. In this case, when the output signal of switching amplifier 1022 is fed back, signals that pass through elements such as switching amplifier 1022 have delays. Amplifying device 1A according to the sixth exemplary embodiment reduces such delays.

Figure 28:
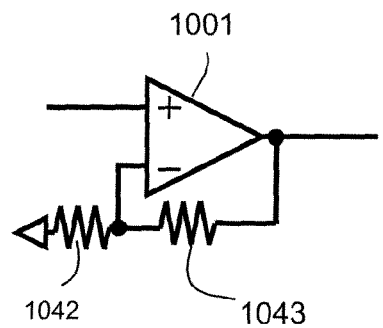
FIG. 28 is a schematic diagram showing an example of a structure of an analog linear amplifier.

Although a resistor is not located in the feedback path of analog linear amplifier 1001 of the amplifying device 1A according to each exemplary embodiment, a resistor may be located in the feedback path of analog linear amplifier 1001 as shown in FIG. 28 so as to obtain a predetermined gain. FIG. 28 is a schematic diagram showing another example of the structure of analog linear amplifier 1001.

With reference to the exemplary embodiments, the present invention has been described. However, it should be understood by those skilled in the art that the structure and details of the present invention may be changed in various manners without departing from the scope of the present invention.

The present application claims a priority based on Japanese Patent Application JP 2009-261919 filed on Nov. 17, 2009, the entire contents of which are incorporated herein by reference in its entirety.

DESCRIPTION OF REFERENCE NUMERALS

1, 1A Amplifying devices
1*a*, 1*a*A Envelope amplifiers
1001, 1010 Analog linear amplifiers
1002 Digital amplifier
1002*a* Output terminal
1002*b* Digital amplifier
1003 Power amplifier
1003*a* Power supply terminal
1004 Dummy power amplifier
1004*a* Power supply terminal
1004*b* Input terminal
1005, 1006 Output circuits
1005*a* Combining section
1005*b*, 1006*a* Analog input terminals
1005*c*, 1006*b* Digital input terminals
1005*d*, 1006*c* Output terminals
1007, 1008 Low pass filters (LPFs)
1007*a*, 1008*a* Output terminals
1040, 1041 Resistors
1040*a* First end of resistor 1040
1040*b* Second end of resistor 1040
1050, 1051 Inductor elements
1020 Comparator
1021 Gate driver circuit Switch amplifier
1101, 1022*a* p-MOS transistors
1102, 1022*b* n-MOS transistors
1110 Inverter
1060, 1061 Loads
1090 Diode

The invention claimed is:

1. An amplifying device comprising: an amplifier that amplifies an input signal;
and an output unit that supplies an output signal, which is adjusted corresponding to an envelope signal of said input signal, to a power supply terminal of said amplifier,
wherein said output unit includes:
an analog amplifying circuit that amplifies said envelope signal;
a digital circuit that selectively outputs a first voltage or a second voltage that is lower than said first voltage; and
first and second output circuits that accept an output signal of said analog amplifying circuit and an output signal of said digital circuit,
wherein said first output circuit includes:
a first integrating circuit that integrates an output signal of said digital circuit; and
a combining section that combines an output signal of said first integrating circuit and an output signal of said analog amplifying circuit and outputs the combined signal to a power supply terminal of said amplifier,
wherein said second output circuit includes:
a second integrating circuit that integrates the output signal of said digital circuit, said second integrating circuit having an impedance higher than said first integrating circuit;
a resistor having two ends, one end being connected to an output terminal of said second integrating circuit, the other end being connected to an output terminal of said analog amplifying circuit, and a load connected to the output terminal of said second integrating circuit, and wherein said digital circuit outputs said first voltage in a first state where a voltage applied at the one end of said resistor is lower than the voltage applied at the other end of said resistor and said digital circuit outputs said second voltage in a second state where the voltage applied at the one end of said resistor is higher than the voltage applied at the other end of said resistor.

2. The amplifying device according to claim 1, wherein said digital circuit further includes:

a comparator that compares the voltage applied at the one end of said resistor with the voltage applied at the other end of said resistor; and a digital amplifier that outputs said first voltage when a compared result of said comparator represents said first state and that outputs said second voltage when the compared result of said comparator represents said second state, and wherein said analog amplifying circuit is an analog linear amplifier that linearly amplifies said envelope signal.

3. The amplifying device according to claim 2, wherein said comparator does not change said compared result even if a relationship between the voltage applied at the one end of said resistor and the voltage applied at the other end of said resistor is reversed unless an absolute value of a difference between the voltage applied at the one end of said resistor and the voltage applied at the other end of said resistor does not exceed a predetermined value and said comparator changes said compared result when the absolute value of the difference between the voltage applied at the one end of said resistor and the voltage applied at the other end of said resistor exceeds the predetermined value, wherein said digital amplifier includes a gate driver circuit and a switching amplifier, wherein said switching amplifier includes a p-MOS transistor and an n-MOS transistor, wherein a high potential side voltage of a supply voltage of said digital amplifier is applied as said first voltage at a source terminal and a substrate terminal of said p-MOS transistor, wherein a low potential side voltage of the supply voltage of said digital amplifier is applied as said second voltage at a source terminal and a substrate terminal of said n-MOS transistor, wherein a drain terminal of said n-MOS transistor and a drain terminal of said p-MOS transistor are connected and used as an output terminal, and wherein said gate driver circuit includes an inverter that turns on said p-MOS transistor and turns off said n-MOS transistor when said compared result of said comparator represents said first state and that turns off said p-MOS transistor and turns on said n-MOS transistor when the compared result of said comparator represents said second state.

4. The amplifying device according to claim 3, wherein said gate driver circuit also prohibits said p-MOS transistor and said n-MOS transistor from being simultaneously turned on.

5. The amplifying device according to claim 1, wherein an impedance viewed from a terminal that accepts the output signal of said analog amplifying circuit of the terminals of said first output circuit to said first output circuit is lower than an impedance viewed from a terminal that accepts the output signal of said analog amplifying circuit of the terminals of said output terminals to said second output circuit, and wherein an impedance viewed from a terminal that accepts the output signal of said digital circuit of the terminals of said first output circuit to said first output circuit is lower than an impedance viewed from a terminal that accepts the output signal of said digital circuit of the terminals of said second output circuit to said second output terminal.

6. The amplifying device according to claim 1, wherein said first output circuit includes a resistor element that is connected between a terminal that accepts the output signal of said analog amplifying circuit and said combining section, the resistor element having a resistance lower than said resistor.

7. The amplifying device according to claim 1, wherein said load comprises a dummy amplifier.

8. The amplifying device according to claim 1, wherein said load comprises a load impedance element.

9. The amplifying device according to claim 7, wherein said dummy amplifier has an impedance higher than said amplifier.

10. The amplifying device according to claim 8, wherein said load impedance element has an impedance higher than an impedance viewed from said power supply terminal to said amplifier.

11. The amplifying device according to claim 2, wherein an impedance viewed from a terminal that accepts the output signal of said analog amplifying circuit of the terminals of said first output circuit to said first output circuit is lower than an impedance viewed from a terminal that accepts the output signal of said analog amplifying circuit of the terminals of said output terminals to said second output circuit, and wherein an impedance viewed from a terminal that accepts the output signal of said digital circuit of the terminals of said first output circuit to said first output circuit is lower than an impedance viewed from a terminal that accepts the output signal of said digital circuit of the terminals of said second output circuit to said second output terminal.

12. The amplifying device according to claim 3, wherein an impedance viewed from a terminal that accepts the output signal of said analog amplifying circuit of the terminals of said first output circuit to said first output circuit is lower than an impedance viewed from a terminal that accepts the output signal of said analog amplifying circuit of the terminals of said output terminals to said second output circuit, and wherein an impedance viewed from a terminal that accepts the output signal of said digital circuit of the terminals of said first output circuit to said first output circuit is lower than an impedance viewed from a terminal that accepts the output signal of said digital circuit of the terminals of said second output circuit to said second output terminal.

13. The amplifying device according to claim 4, wherein an impedance viewed from a terminal that accepts the output signal of said analog amplifying circuit of the terminals of said first output circuit to said first output circuit is lower than an impedance viewed from a terminal that accepts the output signal of said analog amplifying circuit of the terminals of said output terminals to said second output circuit, and wherein an impedance viewed from a terminal that accepts the output signal of said digital circuit of the terminals of said first output circuit to said first output circuit is lower than an impedance viewed from a terminal that accepts the output signal of said digital circuit of the terminals of said second output circuit to said second output terminal.

14. The amplifying device according to claim 2,
wherein said first output circuit includes a resistor element that is connected between a terminal that accepts the output signal of said analog amplifying circuit and said combining section, the resistor element having a resistance lower than said resistor.

15. The amplifying device according to claim 3,
wherein said first output circuit includes a resistor element that is connected between a terminal that accepts the output signal of said analog amplifying circuit and said combining section, the resistor element having a resistance lower than said resistor.

16. The amplifying device according to claim 4,
wherein said first output circuit includes a resistor element that is connected between a terminal that accepts the output signal of said analog amplifying circuit and said combining section, the resistor element having a resistance lower than said resistor.

17. The amplifying device according to claim 5,
wherein said first output circuit includes a resistor element that is connected between a terminal that accepts the output signal of said analog amplifying circuit and said combining section, the resistor element having a resistance lower than said resistor.

18. The amplifying device according to claim 2,
wherein said load comprises a dummy amplifier.

19. The amplifying device according to claim 3,
wherein said load comprises a dummy amplifier.

20. The amplifying device according to claim 4,
wherein said load comprises a dummy amplifier.

* * * * *